United States Patent
Chih et al.

(10) Patent No.: US 11,024,381 B2
(45) Date of Patent: *Jun. 1, 2021

(54) RESISTIVE RANDOM ACCESS MEMORY DEVICE

(71) Applicant: Taiwan Semiconductor Manufacturing Co., Ltd., Hsinchu (TW)

(72) Inventors: Yu-Der Chih, Hsin-Chu (TW); Chung-Cheng Chou, Hsin-Chu (TW); Wen-Ting Chu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/003,761

(22) Filed: Aug. 26, 2020

(65) Prior Publication Data

US 2020/0395070 A1  Dec. 17, 2020

Related U.S. Application Data

(63) Continuation of application No. 16/158,498, filed on Oct. 12, 2018, now Pat. No. 10,762,960.
(Continued)

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/003* (2013.01); *G11C 13/004* (2013.01);
(Continued)

(58) Field of Classification Search
CPC ............ G11C 13/0007; G11C 13/0026; G11C 13/0028
(Continued)

(56) References Cited

U.S. PATENT DOCUMENTS

| 10,762,960 B2 * | 9/2020 | Chih ................... H01L 45/1253 |
| 2015/0103588 A1 | 4/2015 | Son |
| 2017/0309330 A1 | 10/2017 | Pyo |

FOREIGN PATENT DOCUMENTS

| KR | 1020150043759 A | 4/2015 |
| KR | 1020170120446 A | 10/2017 |

(Continued)

*Primary Examiner* — Hoai V Ho
*Assistant Examiner* — Minh Dinh
(74) *Attorney, Agent, or Firm* — Duane Morris LLP

(57) ABSTRACT

A memory architecture includes: a plurality of cell arrays each of which comprises a plurality of bit cells, wherein each of bit cells of the plurality of cell arrays uses a respective variable resistance dielectric layer to transition between first and second logic states; and a control logic circuit, coupled to the plurality of cell arrays, and configured to cause a first information bit to be written into respective bit cells of a pair of cell arrays as an original logic state of the first information bit and a logically complementary logic state of the first information bit, wherein the respective variable resistance dielectric layers are formed by using a same recipe of deposition equipment and have different diameters.

20 Claims, 8 Drawing Sheets

Related U.S. Application Data

(60) Provisional application No. 62/592,574, filed on Nov. 30, 2017.

(51) Int. Cl.
*H01L 27/24* (2006.01)
*H01L 45/00* (2006.01)

(52) U.S. Cl.
CPC ...... *G11C 13/0026* (2013.01); *G11C 13/0028* (2013.01); *H01L 27/2436* (2013.01); *H01L 27/2463* (2013.01); *H01L 27/2481* (2013.01); *H01L 45/1206* (2013.01); *H01L 45/1253* (2013.01); *G11C 13/0007* (2013.01); *G11C 2013/0045* (2013.01); *G11C 2013/0054* (2013.01); *G11C 2013/0078* (2013.01); *G11C 2213/79* (2013.01); *H01L 45/04* (2013.01); *H01L 45/1233* (2013.01); *H01L 45/146* (2013.01)

(58) Field of Classification Search
USPC .......................................................... 365/148
See application file for complete search history.

(56) References Cited

FOREIGN PATENT DOCUMENTS

| | | |
|---|---|---|
| TW | 201135737 A1 | 10/2011 |
| TW | 201545279 A | 12/2015 |

\* cited by examiner

RESISTIVE RANDOM ACCESS MEMORY DEVICE

CROSS-REFERENCE TO RELATED APPLICATIONS

The present application is a continuation of U.S. patent application Ser. No. 16/158,498, filed on Oct. 12, 2018, which claims priority to U.S. Provisional Patent Application No. 62/592,574, filed on Nov. 30, 2017, each of which is incorporated by reference herein in its entirety.

BACKGROUND

Integrated circuits that serve as memory devices or include memory portions are very popular and serve a variety of functions in the electronics world. Resistive random-access memory (RRAM) devices are non-volatile memory type devices formed using semiconductor manufacturing methods. The RRAM device bears some similarities to conductive-bridging RAM (CBRAM) and phase change memory devices.

Generally, RRAM devices operate under the principle that a dielectric, which is normally insulating, can be made to conduct through a filament or conduction path formed after the application of a sufficiently high voltage. The conduction path formation can arise from different mechanisms, including but not limited to defect, metal migration, oxygen vacancy, etc. Various different dielectric materials may be used in RRAM devices. Once the filament or conduction path is formed, it may be reset, i.e. broken, resulting in a high resistance state (HRS) or set, i.e. re-formed, resulting in a lower resistance (LRS), by an appropriately applied voltage, respectively.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
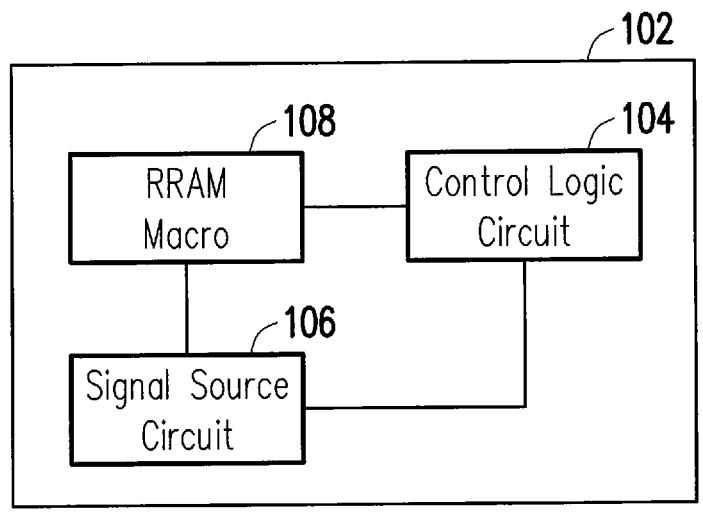
FIG. 1 illustrates an exemplary block diagram of a resistive random access memory (RRAM) architecture, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Additionally, it will be understood that when an element is referred to as being "connected to" or "coupled to" another element, it may be directly connected to or coupled to the other element, or one or more intervening elements may be present.

In recent years, unconventional nonvolatile memory (NVM) devices, such as ferroelectric random access memory (FRAM) devices, magnetic random access memory (MRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

In general, an RRAM device, or more particularly an RRAM cell, includes an upper (anode) electrode and a lower (cathode) electrode with a variable resistance dielectric layer interposed between the upper and lower electrodes. In some examples, an RRAM cell may further include a capping layer interposed between the upper electrode and the variable resistance dielectric layer thereby causing the RRAM cell to have a bipolar switching behavior. The term "bipolar" as used herein refers to the two voltage polarities of an RRAM cell that exhibits a first conductive behavior with a first polarity of voltage applied across the upper and lower electrodes, and a second conductive behavior with a second polarity (a polarity opposite to the first polarity) of voltage applied across the upper and lower electrodes.

As described above, during a write operation to the RRAM cell, a 'set' voltage is applied across the upper and lower electrodes to change the variable resistance dielectric layer from a first resistivity (e.g., a high resistance state (HRS)) to a second resistivity (e.g., a low resistance state (LRS)). Similarly, a 'reset' voltage is applied across the upper and lower electrodes to change the variable resistance dielectric layer from the second resistivity back to the first resistivity, for example, from LRS to HRS. Therefore, in instances where the LRS and HRS correspond to logic "1" and logic "0" states (or vice versa), respectively, the 'set' and 'reset' voltages can be used to store digital information bits in the RRAM cell.

Various figures-of-merit are used to assess performance of an RRAM cell. In particular, among the various figures-of-merit, endurance of an RRAM cell is generally used to assess for which application the RRAM cell is suitable. Endurance of an RRAM cell is referred to the number of cycles (from HRS to LRS, or vice versa) the RRAM cell can endure before the HRS and LRS of the RRAM cell become indistinguishable. Depending on the type of application in which an RRAM cell will be used, an RRAM cell with a particular endurance level or range may be selected for a certain application. For example, when an RRAM cell is used for an electrical fuse (eFuse), the endurance of the eFuse RRAM cell is typically less than about 10 cycles. In another example, when an RRAM cell is used as a multi-time programmable (MTP) memory device, the endurance of the MTP RRAM device is typically between about 10 and 1,000 cycles. Yet in another example, when an RRAM cell is used to store data (e.g., a flash memory device), the endurance of such an RRAM cell is typically between about 10,000 and 100,000 cycles. The figures-of-merit (e.g., endurance, retention time, etc.) of an RRAM cell may be determined by selecting a particular thickness and/or crystalline structure of the variable resistance dielectric layer in the RRAM cell, as described in further detail below.

In order to fabricate an RRAM device having plural RRAM cells on a single chip/die that can be used in multiple applications that each requires a respective different endurance, conventionally, multiple recipes to form multiple variable resistance dielectric layers, each with different thickness and/or crystalline structure, are typically used. As such, extra amounts of time/cost/fabrication steps may be used to produce an RRAM device that can be used in two or more applications. Thus, the conventional RRAM devices have not been entirely satisfactory in every aspect.

Embodiments of the present disclosure provide a novel RRAM architecture that includes a plurality of RRAM cell arrays integrated as an RRAM macro, wherein each RRAM cell array includes a plurality of RRAM cells. In some embodiments, at least a pair of the plurality of RRAM cell arrays are configured to present one information bit as two complementary logic states at respective RRAM cells through write operations. That is, an RRAM cell of one of the pair of RRAM cell arrays is configured to present an information bit as its original logic state; and an RRAM cell of the other of the pair of RRAM cell array pairs is configured to present the information bit as its complementary logic state. As such, when compared to conventional RRAM devices that rely on a fixed reference current signal to read out respective logic states, the pair of RRAM cell arrays of the disclosed RRAM architecture can present a greater difference between respective read current signals while being read out, which in turn can lower magnitudes of write voltage signals (e.g., the set/reset voltages as mentioned above). Thus, such a pair of RRAM cell arrays may be used in applications that require higher endurance.

Further, in some embodiments, the RRAM macro may include at least one RRAM cell array, different from the pair of RRAM cell arrays, that is configured to present information bits in their respective logic states. Such an RRAM cell array may be used in applications that require lower endurance, in accordance with some embodiments. In some embodiments, each RRAM cell array of the RRAM macro uses an universal variable resistance dielectric layer with a particular thickness and/or crystalline structure, formed by using a single same recipe, in its respective RRAM cells. Thus, even when only a single recipe is used to form the respective variable resistance dielectric layers, the disclosed RRAM architecture can incorporate multiple RRAM cell arrays suitable for multiple applications (e.g., eFuse, MTP, data storage, etc.) on a single chip by using the single recipe without the requirements of extra amounts of time/cost/fabrication steps, as seen in conventional RRAM devices. This is because different RRAM cell arrays on the single chip can have different memory elements, e.g. the variable resistance dielectric layers, in terms of different diameters to satisfy different operating endurances.

FIG. 1 illustrates an exemplary block diagram of a disclosed RRAM architecture 100 in accordance with various embodiments. As shown, the RRAM architecture 100 is formed on a single chip/die 102, and the RRAM architecture 100 includes a control logic circuit 104, a signal source circuit 106 coupled to the control logic circuit 104, and at least one RRAM macro 108 coupled to the control logic circuit 104 and the signal source circuit 106, respectively. While any number of RRAM macros may be integrated into the RRAM architecture 100 and remain within the scope of the present disclosure, for clarity of discussion, one RRAM macro (e.g., 108) is shown in the illustrated embodiment of FIG. 1.

In some embodiments, the RRAM macro 108 includes a plurality of RRAM cell arrays, each of which includes a plurality of RRAM cells, which will be discussed with reference to FIGS. 2 and 3. In some embodiments, the control logic circuit 104 is configured to cause at least a pair of the plurality of RRAM cell arrays to present a single information bit as its original and complementary logic states so as to suit such a pair of RRAM cell arrays for higher-endurance applications; and cause at least another one of the plurality of RRAM cell arrays to present a single information bit at its original logic state so as to suit such an RRAM cell array for lower-endurance applications. In some embodiments, the signal source circuit 106, which may be provided by a voltage converter (e.g., a charge pump), is configured to provide one or more voltage signals to the RRAM cells of the RRAM macro 108 for respective read/write operations. Details of the signal source circuit 106 will be discussed with reference to FIGS. 5A and 5B.

Figure 2:
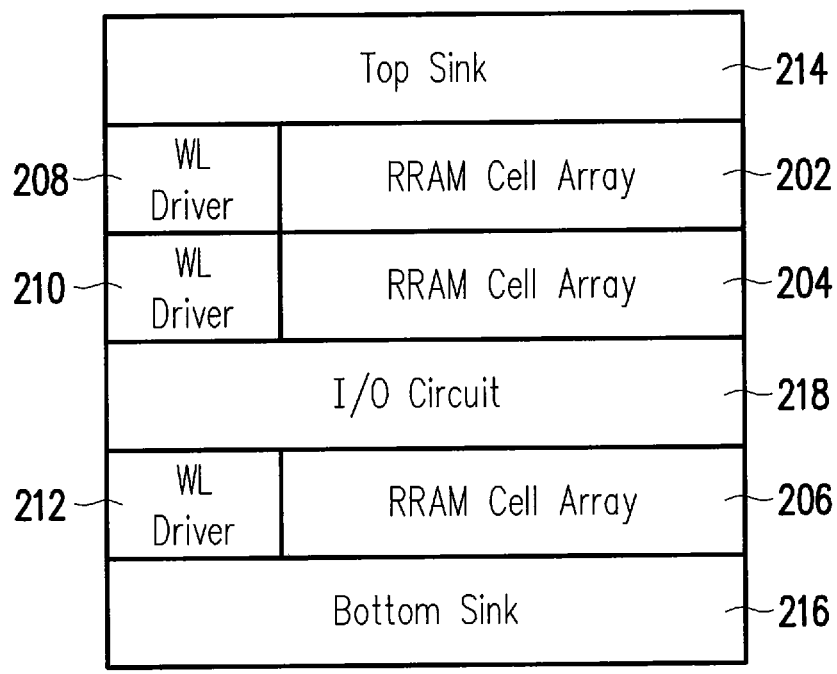
FIG. 2 illustrates an exemplary block diagram of an RRAM macro of the RRAM architecture of FIG. 1 in accordance with some embodiments.

FIG. 2 illustrates a top view of an exemplary block diagram of the RRAM macro 108 of the RRAM architecture 100 of FIG. 1, in accordance with some embodiments. Other RRAM macros of the RRAM architecture 100 not shown in FIG. 1 may be each substantially similar to the illustrated embodiment of RRAM macro 108 of FIG. 2. As shown in FIG. 2, the RRAM macro 108 includes RRAM cell arrays 202, 204, and 206, word line (WL) drivers 208, 210, and 212, a top sink 214, a bottom sink 216, and an input/output (I/O) circuit 218. Although the RRAM macro 108 includes three RRAM cell arrays in the illustrated embodiment of FIG. 2, it is understood that the RRAM macro 108 may include any plurality number of RRAM cell arrays while remaining within the scope of the present disclosure.

In some embodiments, each RRAM cell array of the RRAM macro 108 is coupled with a respective WL driver. For example, the RRAM cell array 202 is coupled with the WL driver 208; the RRAM cell array 204 is coupled with the WL driver 210; and the RRAM cell array 206 is coupled with the WL driver 212. On the other hand, the top and bottom sinks 214/216, and the I/O circuit 218 (which includes sensing amplifier(s), multiplexer(s), bit line (BL) driver(s), etc., as will be discussed below) may be shared by the RRAM cell arrays 202-206, in accordance with some embodiments of the present disclosure. Alternatively stated, the top and bottom sinks 214/216 and I/O circuit 218 may be globally used by the top and bottom sinks 214/216 and I/O circuit 218 while operating the RRAM macro 108.

In some embodiments, the RRAM cell array 202 has a different memory element size or diameter from those of the RRAM cell arrays 204, 206. For example, each cell in the RRAM cell array 202 may have a smaller diameter, which means a higher operating voltage level and a lower endurance, compared to a cell in the RRAM cell arrays 204, 206. This may be applied when all RRAM cell arrays 202, 204, 206 are same type of circuits (e.g. all lab circuits by utilizing one cell to represent one bit). For different cells to achieve different diameters but same thickness and crystalline structure, a same recipe may be used to fabricate the cells by controlling the layout sizes of the cells. For example, an RRAM cell array 202 having an endurance of e.g. 1 to 10 cycles and RRAM cell arrays 204, 206 having an endurance of e.g. 10,000 and 100,000 cycles can be manufactured in one RRAM macro using a same recipe.

Figure 3:
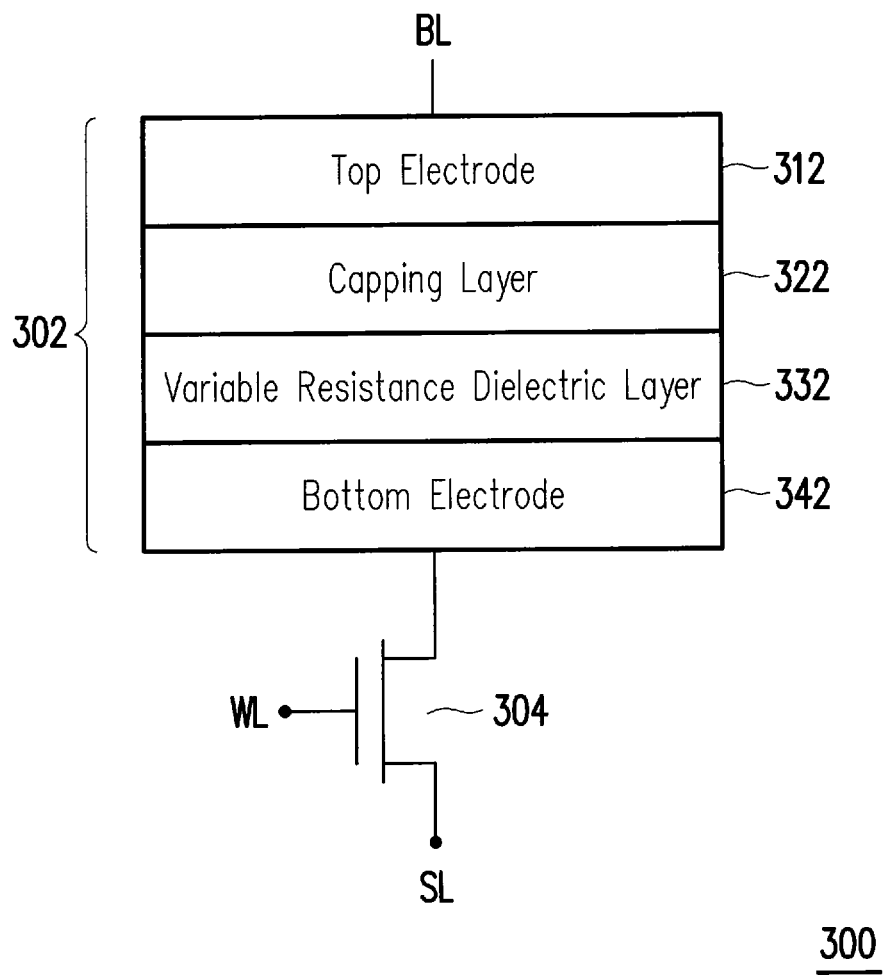
FIG. 3 illustrates an exemplary schematic diagram of an RRAM cell of one of the RRAM cell arrays of the RRAM macro 108 of FIG. 2, in accordance with some embodiments.

FIG. 3 illustrates an exemplary schematic diagram of an RRAM cell 300 of one of the RRAM cell arrays 202/204/206 of the RRAM macro 108 of FIG. 2, in accordance with some embodiments. In the illustrated embodiment of FIG. 3, the exemplary RRAM cell 300 includes a resistor 302 and a transistor 304 coupled to the resistor 302 in series, which can utilized to provide respective resistor and transistor of each of other RRAM cells of the RRAM cell arrays 202/204/206, respectively. Such an RRAM cell 300 is typically referred to as a 1-transistor-1-resistor (1T1R) configuration. Although, in FIG. 3, the RRAM cells (e.g., 300) of the RRAM cell arrays 202/204/206 are implemented as the 1T1R configuration, any of a variety of structures that exhibits a characteristic of variable resistance may be used by the RRAM cells of the RRAM cell arrays 202/204/206 such as, for example, a 1-diode-1-resistor (1D1R) configuration, a 1-selector-1-resistor (1S1R) configuration, a 1-transistor-many resistors (1T-manyR) configuration, etc., while remaining within the scope of the present disclosure.

As shown in FIG. 3, the resistor 302 is formed as a multi-layer stack that includes a top electrode 312, a capping layer 322, a variable resistance dielectric layer 332, and a bottom electrode 342. In some embodiments, the top electrode 312 may be formed from at least one of the materials selected from: Pt, TiN/Ti, TiN, Ru, Ni, and combinations thereof; the capping layer 322 may be formed from at least one of the transition metal materials such as, Ti, Ni, Hf, Nb, Co, Fe, Cu, V, Ta, W, Cr, and combinations thereof the variable resistance dielectric layer 332 may be formed from at least one of the transition metal oxide materials such as, $TiO_x$, $NiO_x$, $HfO_x$, $NbO_x$, $CoO_x$, $FeO_x$, $CuO_x$, $VO_x$, $TaO_x$, $WO_x$, $CrO_x$, and combinations thereof; and the bottom electrode 342 may be formed of at least one of the materials selected from: TiN, TaN, W, Pt, and combinations thereof. In some embodiments, the variable resistance dielectric layer 332 may include a high-k dielectric layer.

To operate (e.g., write a logic state to) the RRAM cell 300 formed as the 1T1R configuration, generally, the transistor 304 is first activated (i.e., turned on) by an enabling/selecting signal through a word line (WL) connected to a gate of the transistor 304, and then a voltage signal (e.g., a set voltage, or a reset voltage) is applied across the RRAM cell 300 through a bit line (BL) and a source line (SL) connected to the top electrode 312 of the resistor 302 and a source of the transistor 304, respectively. For example, to write a logic 1 to the RRAM cell 300, a set voltage is applied across the RRAM cell 300 (e.g., the BL is applied with the set voltage while the SL is connected to ground, or the SL is applied with the set voltage while the BL is connected to ground) to cause the variable resistance dielectric layer 332 to switch to the LRS (low resistance state); and to write a logic 0 to the RRAM cell 300, a reset voltage, with a lower magnitude than the set voltage, is applied across the RRAM cell 300 (e.g., the BL is applied with the reset voltage while the SL is connected to ground, or the SL is applied with the reset voltage while the BL is connected to ground) to cause the variable resistance dielectric layer 332 to switch to the HRS (high resistance state). Similarly, to read out the written logic state from the RRAM cell 300, after the transistor 304 is activated, a read voltage, typically with a lower magnitude than the magnitudes of the set and reset voltages, is applied across the RRAM cell 300, and based on a magnitude of a current signal (which varies because of the resistance state of the variable resistance dielectric layer 332) conducting through the RRAM cell, the logic state written into the RRAM cell 300 can be determined.

In some embodiments, respective polarities of the set and reset voltages to write an RRAM cell are not necessarily to be the same. Specifically, when the polarities are the same (e.g., both positive, or both negative), the RRAM cell is typically referred to as a unipolar RRAM cell; and when the polarities are different from each other (e.g., one is positive and the other is negative), the RRAM cell is typically referred to as a bipolar RRAM cell. In accordance with some embodiments, each RRAM cell of the RRAM cell arrays 202/204/206 of the RRAM macro 108 can be either a bipolar or a unipolar RRAM cell.

In general, the variable resistance dielectric layer (e.g., a transition metal oxide layer) 332 is formed by deposition, for example, atomic layer deposition (ALD), chemical vapor deposition (CVD), meta-organic chemical vapor deposition (MOCVD), etc., to have a particular thickness and crystalline structure using a particular recipe. A recipe may include a variety of control parameters to control the deposition equipment, for example, gas flow rate, chamber pressure, partial pressure of a gas line, temperature, etc. To form a variable resistance dielectric layer with a particular thickness and crystalline structure, a particular value for each of the variety of control parameters may be selected. In some embodiments, the RRAM cells of the RRAM cell arrays 202/204/206 of the RRAM macro 108 are each formed by a single recipe.

Figure 4:
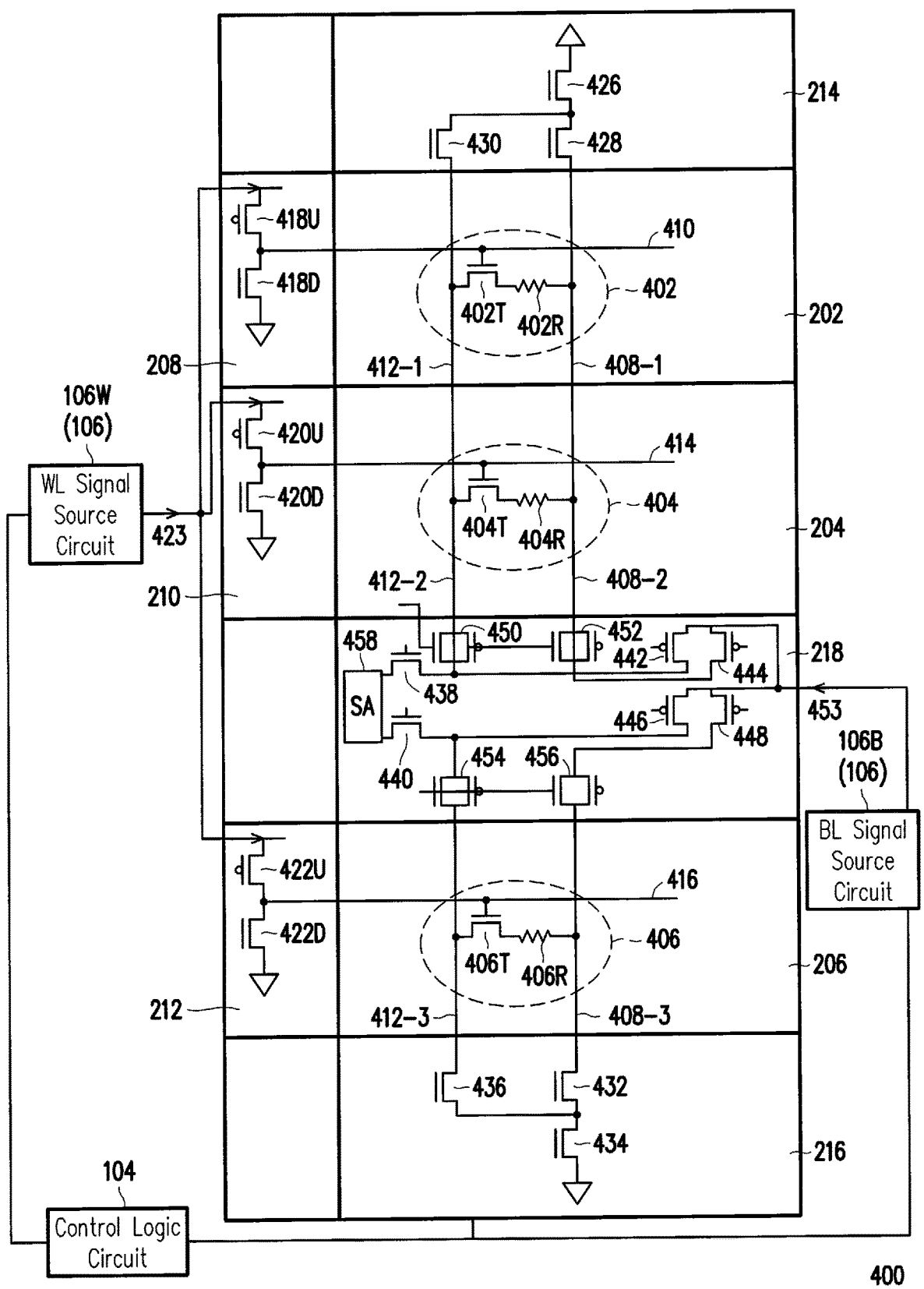
FIG. 4 illustrates an exemplary schematic diagram of the RRAM architecture of FIG. 1, in accordance with some embodiments.

FIG. 4 illustrates an exemplary circuit schematic diagram 400 of the RRAM architecture 100 of FIG. 1, in accordance with some embodiments. Although in the exemplary circuit schematic diagram 400 of FIG. 4, the RRAM cell arrays 202, 204, and 206 each includes one RRAM cell, it is understood that, in some embodiments, the RRAM cell arrays 202, 204, and 206 each includes a plurality of RRAM cells arranged in a column-row configuration, wherein each row includes a respective WL and each column includes respective BL and SL and each of the plurality of RRAM cells is arranged at a respective intersection of column (BL/SL) and row (WL).

For example, the RRAM cell 402 of the plurality of RRAM cells of the RRAM cell array 202 is arranged at an intersection of a first row of plural rows (e.g., a row including WL 410) and a first column of plural columns (e.g., a column including BL 408-1 and SL 412-1) of the RRAM cell array 202; the RRAM cell 404 of the plurality of RRAM cells of the RRAM cell array 204 is arranged at an intersection of a first row of plural rows (e.g., a row including WL 414) and a first column of plural columns (e.g., a column including BL 408-2 and SL 412-2) of the RRAM cell array 204; and the RRAM cell 406 of the plurality of RRAM cells of the RRAM cell array 206 is arranged at an intersection of a first row of plural rows (e.g., a row including WL 416) and a first column of plural columns (e.g., a column including BL 408-3 and SL 412-3) of the RRAM cell array 206.

Further, in some embodiments, the RRAM cells of the RRAM cell arrays 202, 204 and 206 may be each implemented as an 1T1R RRAM cell formed by a resistor and a transistor that are coupled in series (FIG. 3). Such an 1T1R RRAM cell is formed as a three terminal device, wherein the three terminals are respectively coupled to corresponding BL, WL, and SL.

As illustrated in the example of FIG. 4, the RRAM cell array 202 includes an RRAM cell 402 formed by a resistor 402R and a transistor 402T that are coupled in series; the RRAM cell array 204 includes an RRAM cell 404 formed by a resistor 404R and a transistor 404T that are coupled in series; and the RRAM cell array 206 includes an RRAM cell 406 formed by a resistor 406R and a transistor 406T that are coupled in series. Further, the RRAM cell 402 is coupled to the BL 408-1 (through an end of the resistor 402R not connected to the transistor 402T), WL 410 (through a gate of the transistor 402T), and SL 412-1 (through a source of the transistor 402T); the RRAM cell 404 is coupled to the BL 408-2 (through an end of the resistor 404R not connected to the transistor 404T), WL 414 (through a gate of the transistor 404T), and SL 412-2 (through a source of the transistor 404T); and the RRAM cell 406 is coupled to the BL 408-3 (through an end of the resistor 406R not connected to the transistor 406T), WL 416 (through a gate of the transistor 406T), and SL 412-3 (through a source of the transistor 406T).

It is understood that in some embodiments, the BL 408-1 of the RRAM cell array 202 may be coupled to the BL 408-2 of the RRAM cell array 204, but isolated from the BL 408-3 of the RRAM cell array 206 for the purposes of avoiding cross-talk of signals when two RRAM cells on the sides of the I/O circuit 218 (e.g., RRAM cells 404 and 046) are concurrently accessed. Similarly, the SL 412-1 of the RRAM cell array 202 may be coupled to the SL 412-2 of the RRAM cell array 204, but isolated from the SL 412-3 of the RRAM cell array 206 for the same purposes.

In some embodiments, the RRAM cell arrays 202, 204, and 206 are each coupled to the signal source circuit 106 through the respective WL drivers 208/210/212, as mentioned above. More specifically, the RRAM cell arrays 202, 204, and 206 are coupled to a WL signal source circuit 106W of the signal source circuit 106 through respective WL drivers 208, 210, and 212 via corresponding WL's 410, 414, and 416. In some embodiments, each of the WL drivers 208/210/212 includes a pull-up transistor (e.g., a p-type MOSFET) and a pull-down transistor (e.g., an n-type MOSFET) that are coupled to each other in series. It is understood that the pull-up and pull-down transistors may be each implemented as any of various other types of transistors while remaining within the scope of the present disclosure.

For example, the WL driver 208 includes a pull-up transistor 418U and a pull-down transistor 418D; the WL driver 210 includes a pull-up transistor 420U and a pull-down transistor 420D; and the WL driver 212 includes a pull-up transistor 422U and a pull-down transistor 422D. Both of the pull-up and pull-down transistors in each of the WL drivers 208, 210, and 212 are coupled to the control logic circuit 104 at their respective gates and controlled by the control logic circuit 104 to be selectively turned on/off, and the pull-up transistors in each of the WL drivers 208, 210, and 212 are coupled to the WL signal source circuit 106W at their respective sources to receive a WL voltage signal 423, as will be discussed below. Details of the WL signal source circuit 106W will be discussed with reference to FIG. 5A.

In some embodiments, the top and bottom sinks 214 and 216 may respectively include one or more transistors (426, 428, and 430) and (432, 434, and 436) that are each controlled by the control logic circuit 104 to be selectively turned on/off. The transistors 426, 428, 430, 432, 434, and 436 may be each implemented as an n-type MOSFET, or any of various other types of transistors while remaining within the scope of the present disclosure. In some embodiments, the I/O circuit 218 may include transistors 438, 440, 442, 444, 446, and 448, a plurality of transmission gates 450, 452, 454, and 456, and a sensing amplifier (SA) 458.

In some embodiments, the I/O circuit 218 is selectively coupled to the RRAM cell of one or more of the RRAM cell arrays 202, 204, and 206 via corresponding BL's and SL's. In particular, to be accessed (e.g., either written or read), the RRAM cell 402 of the RRAM cell array 202 is selected, by the control logic circuit 104, to be coupled by the I/O circuit 218 through activating the transmission gates 450 and 452; the RRAM cell 404 of the RRAM cell array 204 is selected, by the control logic circuit 104, to be coupled by the I/O circuit 218 through activating the transmission gates 450 and 452; and the RRAM cell 406 of the RRAM cell array 206 is selected, by the control logic circuit 104, to be coupled by the I/O circuit 218 through activating the transmission gates 454 and 456.

In some embodiments, while being written (i.e., corresponding transmission gates have been activated), each RRAM cell of the RRAM cell arrays 202, 204, and 206 is configured to receive a BL voltage signal (e.g., a set voltage, or a reset voltage) 453 from a BL signal source circuit 106B of the signal source circuit through the I/O circuit 218 and then through a corresponding BL or SL. More specifically, the transistors 442, 444, 446, and 448 may be controlled, by the control logic circuit 104, to be selectively turned on/off so as to allow the BL voltage signal 453 to be delivered to a desired RRAM cell through a desired BL or SL. The transistors 442, 444, 446, and 448 may be each implemented as an n-type MOSFET, or any of various other types of transistors while remaining within the scope of the present disclosure.

In some embodiments, while being read (i.e., corresponding transmission gates have been activated), the SA 458 is coupled to the RRAM cell of one of the RRAM cell arrays 202, 204, and 206 through the transistors 438 and 440 that are selectively turned on/off by the control logic circuit 104, or the respective RRAM cells of two RRAM cell arrays disposed on opposite sides of the I/O circuit 218 also through the selective on/off transistors 438 and 440. The transistors 438 and 440 that function as passing gates may be each implemented as an n-type MOSFET, or any of various other types of transistors while remaining within the scope of the present disclosure. Details of the BL signal source circuit 106B and the SA 458 will be discussed with reference to FIG. 5B and FIG. 5C, respectively.

Figure 5A:
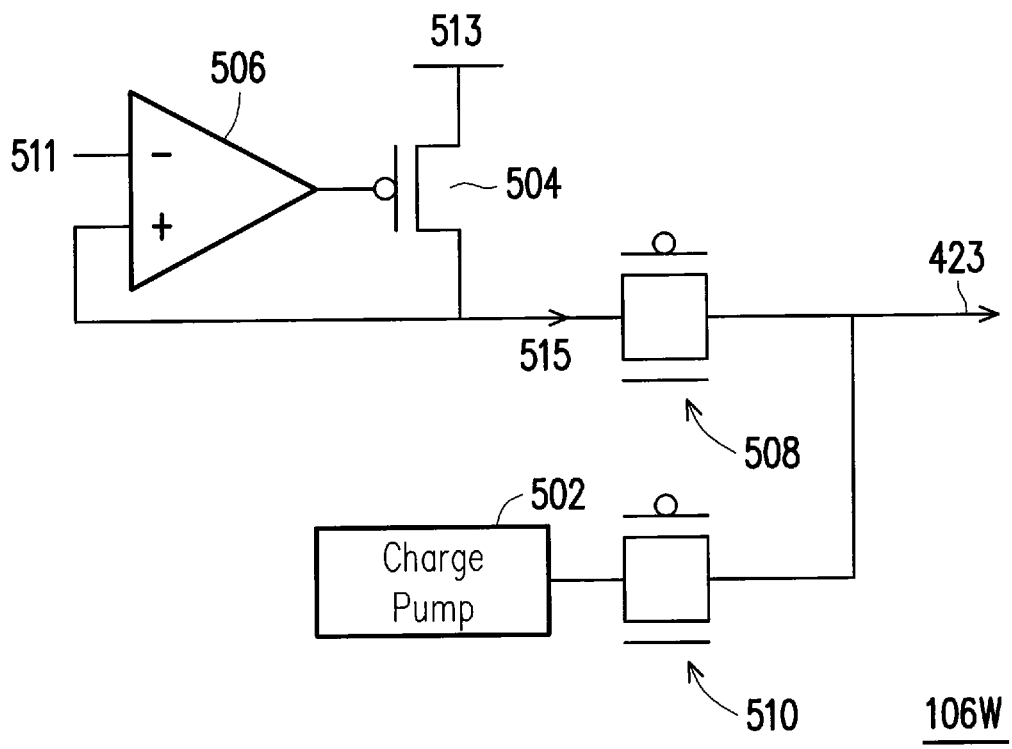
FIG. 5A illustrates an exemplary schematic diagram of a word line (WL) signal source circuit of the RRAM architecture of FIG. 1, in accordance with some embodiments.

FIG. 5A illustrates an exemplary block diagram of the WL signal source circuit 106W of FIG. 4, in accordance with various embodiments. In the illustrated embodiment of FIG. 5A, the WL signal source circuit 106W includes a voltage converter 502 (e.g., a charge pump), a transistor 504 (e.g., a p-type MOSFET), a comparator 506 (e.g., an amplifier), a first transmission gate 508, and a second transmission gate

510. In some embodiments, the comparator 506 has two input terminals and an output terminal wherein one of the input terminals (e.g., an inverting input terminal) is configured to receive a first reference voltage 511. The output terminal of the comparator 506 is coupled to a gate of the transistor 504, and the transistor 504 includes a source coupled to a second reference voltage 513 (e.g., an input/output Vdd) and a drain coupled to the other of the input terminals (e.g., a non-inverting input terminal) of the comparator 506 and the first transmission gate 508. In some embodiments, the comparator 506 and the transistor 504 form a low-dropout (LDO) regulator that is configured to provide a voltage signal 515 whose signal level is substantially close to the second reference voltage 513.

Referring still to FIG. 5A, in some embodiments, the first transmission gate 508 is configured to provide the WL voltage signal 423 based on the voltage signal 515, which is substantially close to the second reference voltage 513. In some other embodiments, the charge pump 502 is configured to provide the WL voltage signal 423 through the second transmission gate 510 when a desired signal level of the WL voltage signal 423 is higher than the second reference voltage 513. In some embodiments, when the desired signal level of the WL voltage signal 423 is not greater than the second reference voltage 513, the WL voltage signal 423 is provided by the LDO regulator, formed by the comparator 506 and the transistor 504, through the first transmission gate 508 such that the WL voltage signal 423's signal level may be equal to the second reference voltage 513.

Figure 5B:
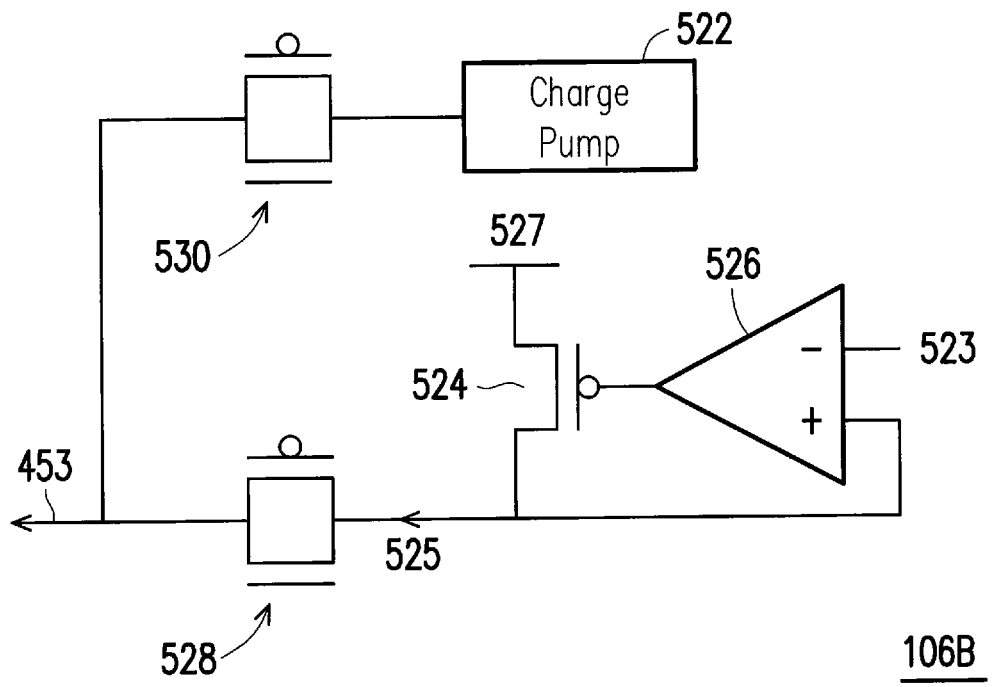
FIG. 5B illustrates an exemplary schematic diagram of a bit line (BL) signal source circuit of the RRAM architecture of FIG. 1, in accordance with some embodiments.

FIG. 5B illustrates an exemplary block diagram of the BL signal source circuit 106B of FIG. 4, in accordance with various embodiments. In the illustrated embodiment of FIG. 5B, the BL signal source circuit 106B includes a voltage converter 522 (e.g., a charge pump), a transistor 524 (e.g., a p-type MOSFET), a comparator 526 (e.g., an amplifier), a first transmission gate 528, and a second transmission gate 530. In some embodiments, the comparator 526 has two input terminals and an output terminal wherein one of the input terminals (e.g., an inverting input terminal) is configured to receive a first reference voltage 523. The output terminal of the comparator 526 is coupled to a gate of the transistor 524, and the transistor 524 includes a source coupled to a second reference voltage 527 (e.g., an input/output Vdd) and a drain coupled to the other of the input terminals (e.g., a non-inverting input terminal) of the comparator 526 and the first transmission gate 528. Similar as the transistor 504 and comparator 506 of the WL signal source circuit 106W as shown in FIG. 5A, the comparator 526 and the transistor 524 form another low-dropout (LDO) regulator that is configured to provide a voltage signal 525 whose signal level is substantially close to the second reference voltage 527.

Referring still to FIG. 5B, in some embodiments, the first transmission gate 528 is configured to provide the BL voltage signal 453 based on the voltage signal 525, which is substantially close to the second reference voltage 527. In some other embodiments, the charge pump 522 is configured to provide the BL voltage signal 453 through the second transmission gate 530 when a desired signal level of the BL voltage signal 453 is higher than the second reference voltage 527. In some embodiments, when the desired signal level of the BL voltage signal 453 is not greater than the second reference voltage 527, the BL voltage signal 453 is provided by the LDO regulator, formed by the comparator 526 and the transistor 524, through the first transmission gate 528 such that the BL voltage signal 453's signal level may be equal to the second reference voltage 527. In some embodiments, the signal level of the WL voltage signal 423 may correspond to the signal level of the BL voltage signal 453. For example, the respective signal levels of the WL voltage signals 423 may be different when the BL voltage signal 453 are equal to the set and reset voltages, respectively.

Figure 5C:
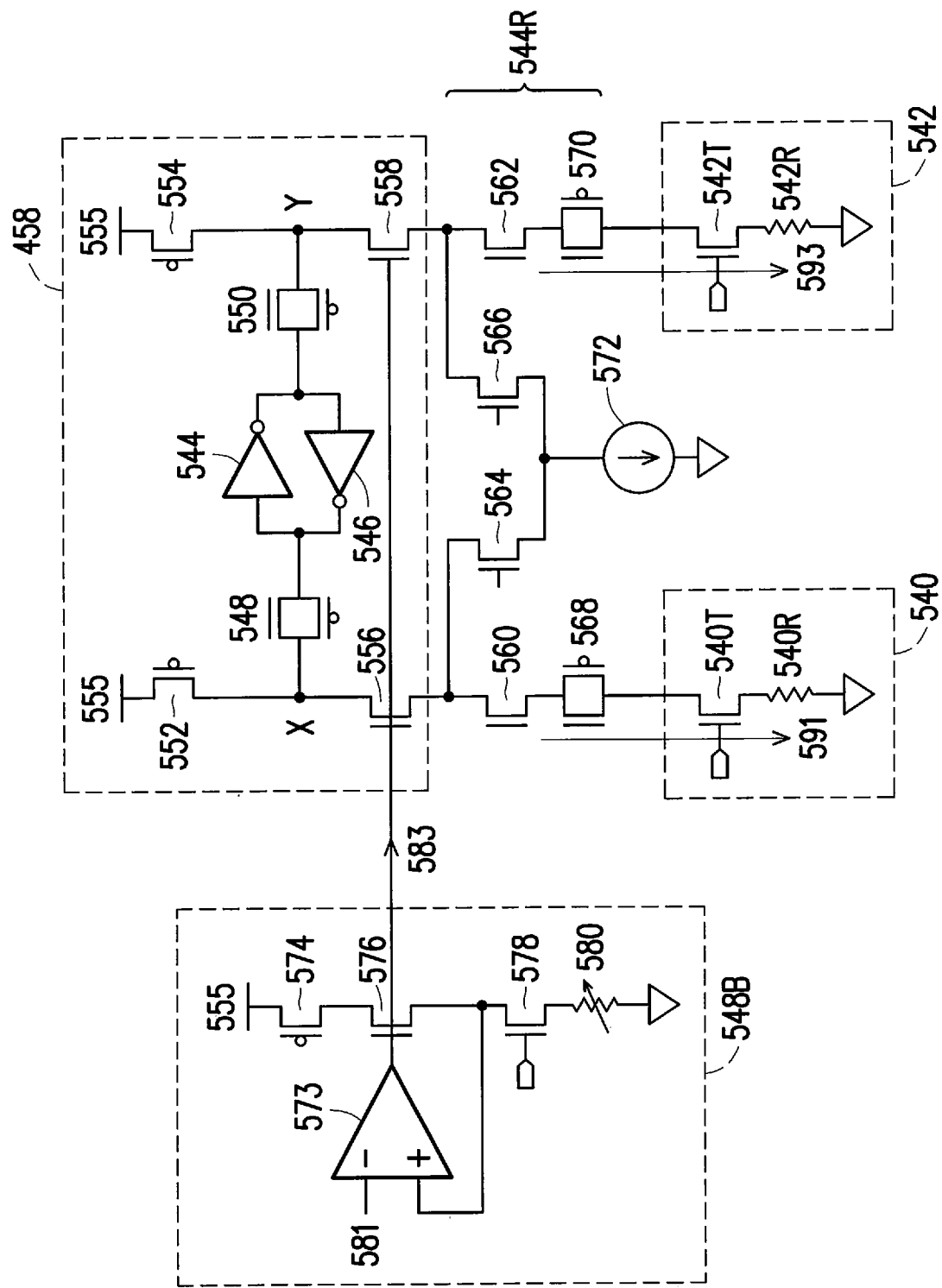
FIG. 5C illustrates an exemplary schematic diagram of a sense amplifier and a portion of an input/output (I/O) circuit of the RRAM architecture of FIG. 1, in accordance with some embodiments.

FIG. 5C illustrates an exemplary circuit diagram of the SA 458 of FIG. 4, in accordance with various embodiments. As shown in the illustrated embodiment of FIG. 5C, the SA 458 is also coupled to two RRAM cells 540 and 542 via a portion of the I/O circuit 218 (FIG. 4), herein referred to as "read circuit 544R," and a bias generator circuit 548B. In some embodiments, the RRAM cells 540 and 542 represent the respective "being-read" RRAM cells of two different ones of the RRAM cell arrays 202, 204, and 206 that are disposed on opposite sides of the I/O circuit 218 such as, for example, RRAM cells 402 and 406, RRAM cells 404 and 406, etc. Accordingly, each of the RRAM cells 540 and 542 is formed by a resistor and a serially coupled transistor, according to some embodiments. For example, the RRAM cell 540 is formed by resistor 540R and transistor 540T; and the RRAM cell 542 is formed by resistor 542R and transistor 542T.

In some embodiments, the SA 458 includes a first inverter 544, a second inverter 546, a first transmission gate 548, a second transmission gate 550, transistors 552, 554, 556, and 558. The first and second inverters 544 and 546 are cross-coupled to form a latch (i.e., the first inverter 544's input terminal coupled to the second inverter 546's output terminal, and the second inverter 546's input terminal coupled to the first inverter 544's output terminal); the first transmission gate 548 is coupled between the first inverter 544's input terminal/second inverter 546's output terminal and node X; the second transmission gate 550 is coupled between the first inverter 544's output terminal/second inverter 546's input terminal and node Y; the transistor 552 (e.g., a p-type MOSFET) is coupled between a reference voltage 555 (e.g., Vdd) and the node X; and the transistor 554 (e.g., a p-type MOSFET) is coupled between the reference voltage 555 and the node Y. In some embodiments, the first and second inverters 544 and 546, the first and second transmission gates s 548 and 550, and the transistors 552 and 554 are configured to perform a sensing/amplifying function so as to determine (e.g., read) logic states of the RRAM cells 540 and 542, which will be discussed below. The transistors 556 and 558 are respectively coupled to the nodes X and Y, and both coupled to the read circuit 544R and the bias generator circuit 548B so as to control a read voltage for the RRAM cells 540 and 542, which will be discussed below.

In some embodiments, the read circuit 544R includes transistors 560, 562, 564, and 566, transmission gates 568 and 570, and a reference current source 572. The transistors 560, 562, 564, and 566 may be each implemented as an n-type MOSFET, or any of various other types of transistors while remaining within the scope of the present disclosure. The RRAM cell 540 is coupled to the SA 458 through the transistor 560 and the transmission gate 568; and the RRAM cell 542 is coupled to the SA 458 through the transistor 562 and the transmission gate 570. In some embodiments, when the RRAM cells 540 and 542 represent the RRAM cells 402 (or 404) and 406 (FIG. 4), respectively, the transistors 560 and 562 may represent the transistors 438 and 440 (FIG. 4), respectively, and the transmission gates 568 and 570 may represent the transmission gates 450 and 454 (FIG. 4), respectively. The read circuit 544R will be discussed in further detail below when operations of the RRAM architecture 100 are discussed.

In some embodiments, the bias generator circuit 548B includes a comparator 573, transistors 574, 576, and 578, and a variable resistor 580. The transistor 574 is implemented as a p-type MOSFET, and the transistors 576 and 578 are each implemented as an n-type MOSFET. It is understood that the transistors 574 to 578 can be implemented as any of various other types of transistors while remaining within the scope of the present disclosure. The comparator 573 has two input terminals and an output terminal wherein one of the input terminals (e.g., a non-inverting input terminal) is configured to receive a read voltage 581. The output terminal of the comparator 573 is coupled to a gate of the transistors 576, and respective gates of the transistors 556 and 558 of the SA 458. The transistor 576 includes a source coupled to the other of the input terminals (e.g., an inverting input terminal) of the comparator 573 and a drain of the transistor 578, and a drain coupled to the reference voltage 555 through the transistor 574. The transistor 578 is coupled to ground through the variable resistor 580, which can be a poly resistor in some embodiments. Further, in some embodiments, the bias generator circuit 548B is configured to provide a voltage signal 583 based on the read voltage 581. The voltage signal 583 is coupled to gates of the transistors 556 and 558. Such a voltage signal 583, controlled at the read voltage 581, can be used by the RRAM cells 540 and/or 542 for respective read operations.

Since FIGS. 4-5C respectively illustrate at least a portion of the RRAM architecture 100, to illustrate the operation of the RRAM architecture 100, reference numerals shown in FIGS. 4-5C are again used in the following discussions. In some embodiments, the RRAM architecture 100 can be used for multiple applications with respective different endurances when different RRAM cell arrays in the RRAM macro 108 have different RRAM element sizes and/or different operating voltage levels. For high-endurance applications, an information bit may be written to at least two RRAM cells of the RRAM arrays, disposed at opposite sides of the I/O circuit 218, at its original and complementary logic states, respectively; and for low-endurance applications, an information bit may be written to the RRAM cell of one of the RRAM arrays, disposed at either side of the I/O circuit 218, at its original logic state. Operations of the RRAM architecture 100 to be used for the high-endurance and low-endurance applications will be respectively discussed below.

In some embodiments, to operate the RRAM architecture 100 for the high-endurance applications, the control logic circuit 104 may first select a pair of RRAM cell arrays (e.g., 204 and 206). In some embodiments, the pair of RRAM cell arrays 204 and 206 are disposed on the opposite sides of the I/O circuit 218. Upon determining the RRAM cell arrays 204 and 206 to be used for high-endurance applications, the control logic circuit 104 selects one RRAM cell from the RRAM cell array 204 to be written into an original logic state of an information bit (e.g., RRAM cell 404), and one RRAM cell from the RRAM cell array 206 to be written into a complementary logic state of the information bit (e.g., RRAM cell 406). In other words, one of the RRAM cells 404 and 406 is set (therefor presenting a logic 1), and the other of the RRAM cells 404 and 406 is reset (therefore presenting a logic 0).

To access the RRAM cell 404, the control logic circuit 104 asserts the RRAM cell 404's respective WL 414 by complementarily turning on/off the transistors 420U and 420D of the WL driver 210 (e.g., turning on the transistor 420U and off the transistor 420D), and BL 408-2 and SL 412-2 by activating the transmission gates 450 and 452 of the I/O circuit 218. Accordingly, the control logic circuit 104 can allow the WL signal source circuit 106W to provide the WL voltage signal 423 to the selected RRAM cell 404 through the asserted WL 414 to activate (turn on) the transistor 404T of the RRAM cell 404. Simultaneously or subsequently, the control logic circuit 104 can allow the BL signal source circuit 106B to provide the BL voltage signal 453 at a signal level of the set voltage to the RRAM cell 404 through the BL 408-2 or SL 412-2 so as to write a logic 1 to the RRAM cell 404. More specifically, during such a write operation, the control logic circuit 104 may turn off the transistors 438 to isolate the SA 458 from accessing the RRAM cell 404, and turn on the transistor 442 (while turning off the transistor 444) to allow the BL voltage signal 453 to be delivered to the RRAM cell 404 via the SL 412-2 or turn on the transistor 444 (while turning off the transistor 442) to allow the BL voltage signal 453 to be delivered to the RRAM cell 404 via the BL 408-2.

In some embodiments, to access the RRAM cell 406, the control logic circuit 104 asserts the RRAM cell 406's respective WL 416 by complementarily turning on/off the transistors 422U and 422D of the WL driver 212 (e.g., turning on the transistor 422U and off the transistor 422D), and BL 408-3 and SL 412-3 by activating the transmission gates 454 and 456 of the I/O circuit 218. Accordingly, the control logic circuit 104 can allow the WL signal source circuit 106W to provide the WL voltage signal 423 to the selected RRAM cell 406 through the asserted WL 416 to activate (turn on) the transistor 406T of the RRAM cell 406. Simultaneously or subsequently, the control logic circuit 104 can allow the BL signal source circuit 106B to provide the BL voltage signal 453 at a signal level of the reset voltage to the RRAM cell 406 through the BL 408-3 or SL 412-3 so as to write a logic 0 to the RRAM cell 406. More specifically, during such a write operation, the control logic circuit 104 may turn off the transistors 438 to isolate the SA 458 from accessing the RRAM cell 406, and turn on the transistor 446 (while turning off the transistor 448) to allow the BL voltage signal 453 to be delivered to the RRAM cell 406 via the SL 412-3 or turn on the transistor 448 (while turning off the transistor 446) to allow the BL voltage signal 453 to be delivered to the RRAM cell 406 via the BL 408-3. It is noted that the write operations performed on the RRAM cells 404 and 406 do not necessarily occur at the same time, in accordance with some embodiments of the present disclosure.

After the RRAM cells 404 and 406 are respectively written into the original logic state (logic 1) and complementary logic state (logic 0) of the information bit, the control logic circuit 104 may concurrently read the respective logic states from the RRAM cells 404 and 406, in accordance with various embodiments. Similar as the write operation described above, the RRAM cells 404 and 406 are allowed to be read by asserting respective WL's 414 and 416 (through complementarily turning on/off the transistors 420U/420D and 422U/422D), and BL's 408-2 and 408-3 and SL's 412-2 and 412-3 (through activating the transmission gates 450, 452, 454, and 456). To read out the logic states present by the RRAM cells 404 and 406, in some embodiments, the control logic circuit 104 may turn off the transistors 442, 444, 446, and 448 to isolate the BL voltage signal 453 from the RRAM cells 404 and 406, and turn on the transistors 438 and 440 to allow the SA 458 to access the RRAM cells 404 and 406.

Referring again to FIG. 5C, as mentioned above, the two RRAM cells 540 and 542 represent the RRAM cells being read (i.e., the RRAM cell 404 and 406 in the current example), the transistors 560 and 562 respectively represent the being-read RRAM cells' corresponding pass gate transistors 438 and 440 (FIG. 4), and the transmission gates 568 and 570 respectively represent the being-read RRAM cells' corresponding transmission gates 450 and 454 (FIG. 4). In some embodiments, to read the respective logic states from the two RRAM cells 540 (e.g., 404) and 542 (e.g., 406) that are disposed in different arrays, the control logic circuit 104 may first turn off the transistors 564 and 566 to isolate the reference current source 572 from the RRAM cells from the RRAM cells 540 and 542. However, in some embodiments, the control logic circuit 104 may complementarily turn on the transistors 564 and 566 when only one of the RRAM cells 540 and 542 is read, which will be discussed below.

Referring still to FIG. 5C, in some embodiments, the control logic circuit 104 may turn on the transistor 574 to activate the bias generator circuit 548B. Upon being activated, an LDO circuit, formed by the comparator 573 and the transistor 576, is configured to provide the voltage signal 583 with a signal level substantially close to the read voltage 581. Further, such an LDO circuit may rely on the transistor 578 and the variable resistor 580 that can simulate a loading of the read RRAM cells 540/542 so as to provide a more reliable read voltage to the RRAM cells 540 and 542. As mentioned above, the transistors 556 and 558 are configured to receive the voltage signal 583 at the read voltage as provided by the bias generator circuit 548B. In some embodiments, such a read voltage is applied to the RRAM cell 540 (e.g., 404) via the SL 412-2 and the RRAM cell 542 (e.g., 406) via the SL 412-3 while the respective BL's 408-2 and 408-3 may be coupled to ground. Since the respective transistors 404T and 406T of the RRAM cells 540 (e.g., 404) and 542 (e.g., 406) are turned on (i.e., both representing a substantially similar ON resistance), current signals 591 and 593 (FIG. 5C) conducting through the respective resistors 404R of the RRAM cell 540, which has been set to the LRS, and 406R of the RRAM cell 542, which has been reset to the HRS, may have respective different signal levels. In some embodiments, the current signals 591 and 593 may be concurrently generated to respectively conduct through the RRAM cells 540 and 542. More specifically, in the current example where the RRAM cells 540 and 542 respectively represent the RRAM cells 404 and 406 (FIG. 4), the current signal 591 may flow through the SL 412-2, the transistor 404T, the resistor 404R, the BL 408-2, optionally the BL 408-1, the transistors 428 and 426, and to ground; the current signal 593 may flow through the SL 412-3, the transistor 406T, the resistor 406R, the BL 408-3, the transistors 432 and 434, and to ground. In some embodiments, the transistors 426, 428, 430, 432, 434, and 436 may be selectively turned on or off by the control logic circuit 104. In some embodiments, the current signals 591 and 593 are referred to as the information bit's corresponding LRS and HRS current signals, respectively.

In some embodiments, such two current signals 591 and 593 may change voltage levels at the nodes X and Y until respective voltage levels (i.e., logic states) at the nodes X and Y are latched (i.e., fixed) by the cross-coupled inverters 544 and 546. In some embodiments, prior to the current signals 591 and 593 changing the voltage levels at the nodes X and Y, the control logic circuit 104 may turn on the transistors 552 and 554 to pre-charge the inverters 544 and 546 through the transmission gates 548 and 550, which are optional. After the voltage levels (i.e., logic states) at the nodes X and Y are latched (or determined) by the SA 458, the control logic circuit 104 may accordingly determine the respective logic states present by the RRAM cells 540 (e.g., 404) and 542 (e.g., 406). In the current example, the logic states of the RRAM cells 404 and 406 determined by the control logic circuit 404 may be a logic 1 and a logic 0, respectively.

The control logic circuit 104 of the disclosed RRAM architecture 100 determines a logic state of an information bit by comparing two different current signals conducting through two RRAM cells that were written to an information bit's original and complementary logic states, respectively. By doing so, the SA 458 can more efficiently determine the original logic state of the information bit. This is because in the existing RRAM device whose RRAM's logic state can only be determined by comparing a current signal conducting therethrough with a pre-defined reference current. And a current level of the pre-defined reference current is typically chosen to be in the middle of current levels of two statistic current signals (one is a statistically determined HRS current signal of the existing RRAM device, and the other is a statistically determined LRS current signal of the existing RRAM device) so as to allow a corresponding SA to correctly determine whether the logic state present by the RRAM cell is a logic 1 or 0. As such, a current level difference between the reference current and a to-be determined current signal (either a LRS current signal or a HRS current signal) conducting through any RRAM cell is relatively small. In stark contrast, the SA 458 of the disclosed RRAM architecture 100 relies on two different current signals that have been intentionally conducted as one information bit's corresponding HRS and LRS current signals, which can have a substantially greater current level difference therebetween, to determine the original logic state of the information bit. As a result, when writing a pair of RRAM cells to cause them to respective conduct an information bit's corresponding HRS and LRS current signals, in turn, the voltage levels of the respective set and reset voltages (i.e. the write voltages) can be substantially lower, which allows the RRAM cells to have a higher endurance.

In some embodiments, operating the RRAM architecture 100 to be used for the low-endurance applications is substantially similar to the high-endurance applications as discussed above except that the control logic circuit 104 may cause an information bit to be written into the RRAM cell(s) of one RRAM cell array (e.g., the RRAM cell 402 of the RRAM cell array 202) of the RRAM architecture 100 as its original logic state. Since writing the information bit into the RRAM cell 402 as its original logic state is substantially similar to writing the RRAM cell 404, as discussed above, the discussion is not repeated here. In some embodiments, when reading the logic state written into the RRAM cell 402, a reference current source may be used. Referring again to FIGS. 4 and 5C concurrently, when reading the RRAM cell 402 (corresponding to the being-read RRAM cell 540 in FIG. 5C), the control logic circuit 104 may turn on the transistor 438 (corresponding to the transistor 560 in FIG. 5C) and turn off the transistor 440 (corresponding to the transistor 562 in FIG. 5C), and turn on the transistor 566 and turn off the transistor 564. As such, the SA 458 can compare the current signal 591 conducting through the RRAM cell 540 (e.g., 402) with the a reference current provided by the reference current source 572 so as to determine (read) the logic state of the information bit written to the RRAM cell 540 (e.g., 402). As a result, when writing an RRAM cell to conduct an information bit's corresponding HRS or LRS current signal (depending on the information bit's original logic state), in turn, the RRAM cell may have a lower endurance.

Based on the above-discussed operations of the RRAM architecture 100, it is understood that the control logic circuit 104 can be used in multiple applications with respective different endurances by choosing a pair of the RRAM cell arrays (e.g., 204 and 206) to present respective original and complementary logic states of information bits that are used in high-endurance applications and a single RRAM cell (e.g., e.g., 202) to present original logic states of information bits that are used in low-endurance applications. Moreover, the RRAM cells of such RRAM cell arrays that are used in different applications can be formed on a same chip (e.g., 102 of FIG. 1) by a single recipe.

Figure 5D:
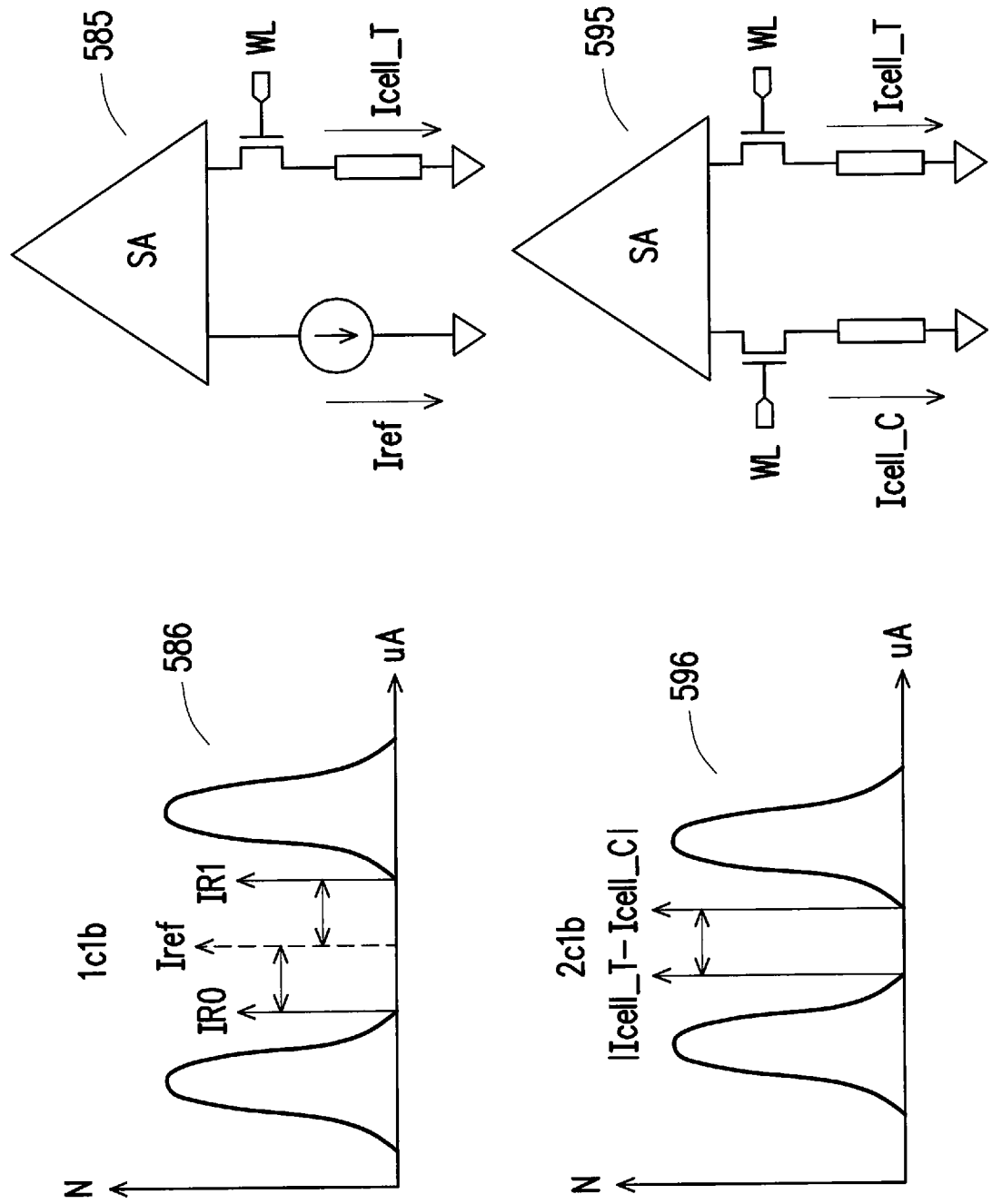
FIG. 5D illustrates exemplary operation comparisons between two types of sensing amplifier circuits, in accordance with some embodiments.

FIG. 5D illustrates exemplary operation comparisons between two types of sensing amplifier circuits, in accordance with some embodiments. The first sensing amplifier (SA) circuit 585 utilizes one cell to represent one bit (1c1b); while the second sensing amplifier (SA) circuit 595 utilizes two cells to represent one bit (2c1b).

For the 1c1b circuit 585, a logic bit is determined by comparing the target cell current Icell_T with the reference current Iref. Two current distributions corresponding to two logic bits (0 and 1) respectively are shown in the operation plot 586 of the 1c1b circuit 585. A key parameter to an endurance of the 1c1b circuit 585 is the tail-to-tail window, i.e. the distance between the two tails, i.e. tail currents corresponding to logic 0 (IR0) and logic 1 (IR1), of the two distributions in the operation plot 586. To distinguish between logic bits 0 and 1, the reference current Iref is put in the middle of the two tail currents of IR0 and IR1. For example, to have an endurance margin of 5 uA, both the distance between Iref and IR0 and the distance between Iref and IR1 need to be 5 uA. As such, a 10 uA tail-to-tail window is needed for the 1c1b circuit 585 to achieve an endurance of 5 uA.

For the 2c1b circuit 595, a logic bit is determined by comparing the target cell current Icell_T with the complimentary current Icell_C that always represents a complimentary logic bit of that represented by the Icell_T. Two current distributions corresponding to two logic bits (0 and 1) respectively are shown in the operation plot 596 of the 2c1b circuit 595. A key parameter to an endurance of the 2c1b circuit 595 is also the tail-to-tail window, i.e. the distance between the two tails of the two distributions of Icell_T and Icell_C. For example, to have an endurance margin of 5 uA, the distance between tails of Icell_T and Icell_C may be 5 uA (or even a smaller distance because it is very unlikely for both Icell_T and Icell_C to fall into the worst case at the two tails at the same time). As such, only a 5 uA tail-to-tail window is needed for the 2c1b circuit 595 to achieve an endurance of 5 uA.

That is, to achieve a same endurance, the 2c1b circuit 595 needs a smaller tail-to-tail window than the 1c1b circuit 585. Alternatively, by having a same tail-to-tail window, the 2c1b circuit 595 will have a higher endurance than the 1c1b circuit 585. As discussed above, a same recipe may be used to manufacture these two types of SA circuits in a same RRAM macro, to save cost and satisfy different endurance applications at the same time. The two types of SA circuits generated by the same recipe will have same thickness and crystalline structure, but different diameters and endurance levels.

Figure 6:
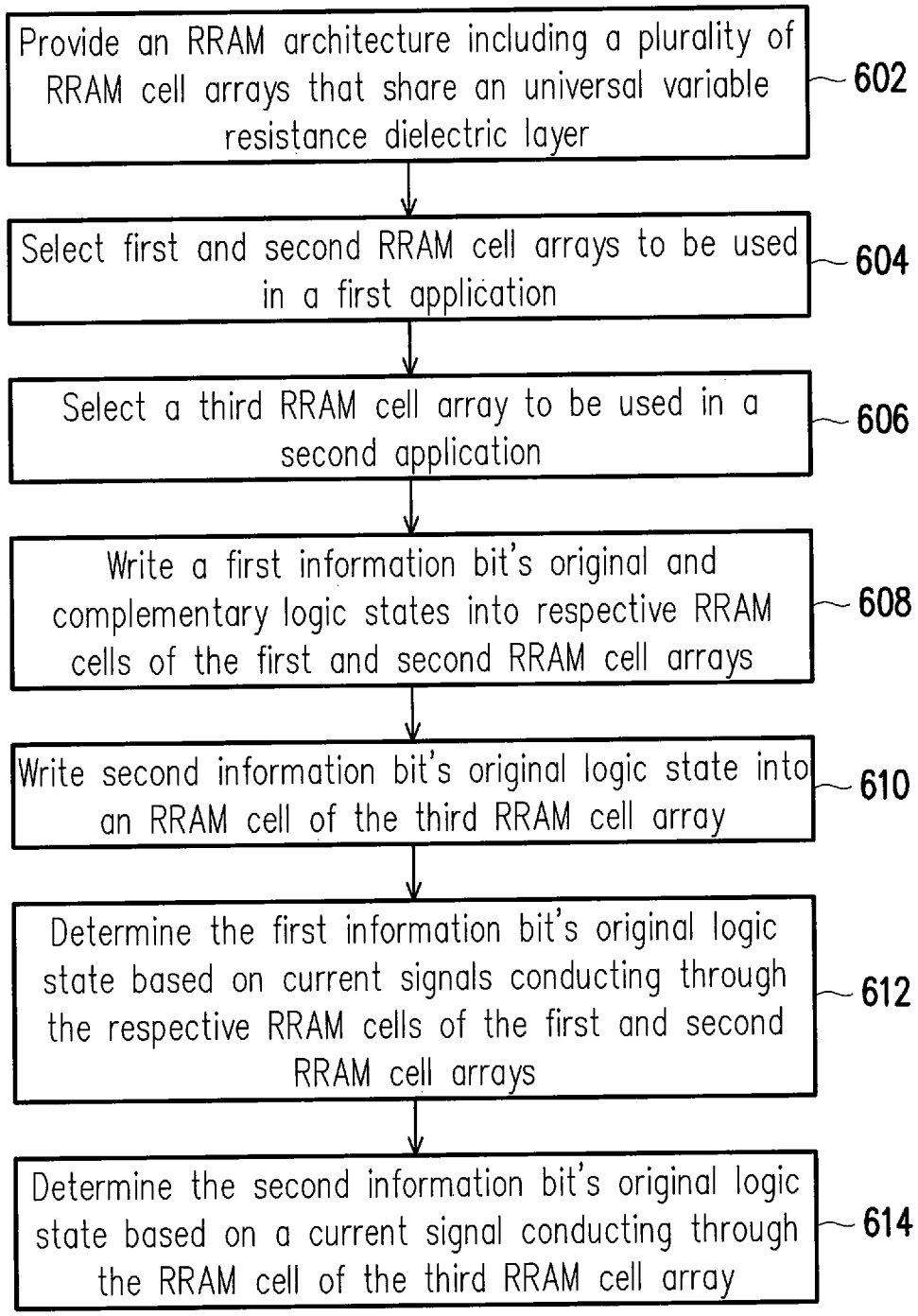
FIG. 6 illustrates a flow chart of an exemplary method to operate the RRAM architecture of FIG. 1, in accordance with some embodiments.

FIG. 6 illustrates a flow chart of an exemplary method 600 to operate the RRAM architecture 100, in accordance with various embodiments. In various embodiments, the operations of the method 600 are performed by the respective components illustrated in FIGS. 1-5C. For purposes of discussion, the following embodiment of the method 600 will be described in conjunction with FIGS. 1-5C. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which an RRAM architecture including a plurality of RRAM cell arrays that share a universal variable resistance dielectric layer is provided. In some embodiments, the plurality of RRAM cell arrays may share a same I/O circuit but each of the RRAM cell arrays corresponds to a respective WL driver. In one example, such an RRAM architecture may include the RRAM architecture 100. As discussed with reference to FIGS. 1 and 2, the RRAM architecture 100 includes an RRAM macro 108 with at least three RRAM cell arrays 202, 204, and 206 disposed on the single chip 102, and the RRAM cells in each of the RRAM cell arrays include an universal variable resistance dielectric layer (e.g., 332 with references to FIG. 3) that is formed by a single recipe.

The method 600 continues to operation 604 in which first and second RRAM cell arrays are selected to be used in a first application. Next, the method 600 continues to operation 606 in which a third RRAM cell array is selected to be used in a second application. In some embodiments, such first and second applications require respective different endurances, for example, the first application may require a higher endurance (e.g., data storage) and the second application may require a lower endurance (e.g., eFuse). In some embodiments, such selection may be performed by the control logic circuit 104. In some embodiments, the first and second RRAM cell arrays are disposed at opposite sides of the shared I/O circuit 218.

The method 600 continues to operation 608 in which a first information bit's original logic state and complementary logic state are written to respective RRAM cells of the first and second RRAM cell arrays. In some embodiments, the first information bit represents a portion of data used in the first application that requires the higher endurance. In some embodiments, the RRAM cell of the first RRAM cell array is written into the information bit's original logic state, and the RRAM cell of the second RRAM cell array is written into the information bit's complementary logic state.

Next, the method 600 continues to operation 610 in which a second information bit's original logic state is written to an RRAM cell of the third RRAM cell array. In some embodiments, the second information bit represents a portion of data used in the second application that requires the lower endurance. In some embodiments, the RRAM cell of the third RRAM cell array is written into the information bit's original logic state.

The method 600 continues to operation 612 in which the first information bit's original logic state is determined based on current signals conducting through the respective RRAM cells of the first and second RRAM cell arrays. In some embodiments, since the first information bit's original and complementary logic states are respectively written to the RRAM cells of the first and second RRAM cell arrays, the current signals may correspond to the first information bit's corresponding HRS (high resistance state) and LRS (low resistance state) current signals. In some embodiments, the original and complementary logic states of the first information bit may be determined by the SA 458 of the shared I/O circuit 218. The method 600 continues to operation 614 in which the second information bit's original logic state is determined based on a current signal conducting through the RRAM cell of the third RRAM cell array. In some embodiments, since the second information bit's original logic state is written to the RRAM cell of the third RRAM cell array, the current signal may correspond to the second information bit's corresponding HRS (high resistance state) or LRS (low resistance state) current signal (based on the second information's original logic state). In some embodiments, the original state of the second information bit may be determined by the SA 458 of the shared I/O circuit 218.

Figure 7:
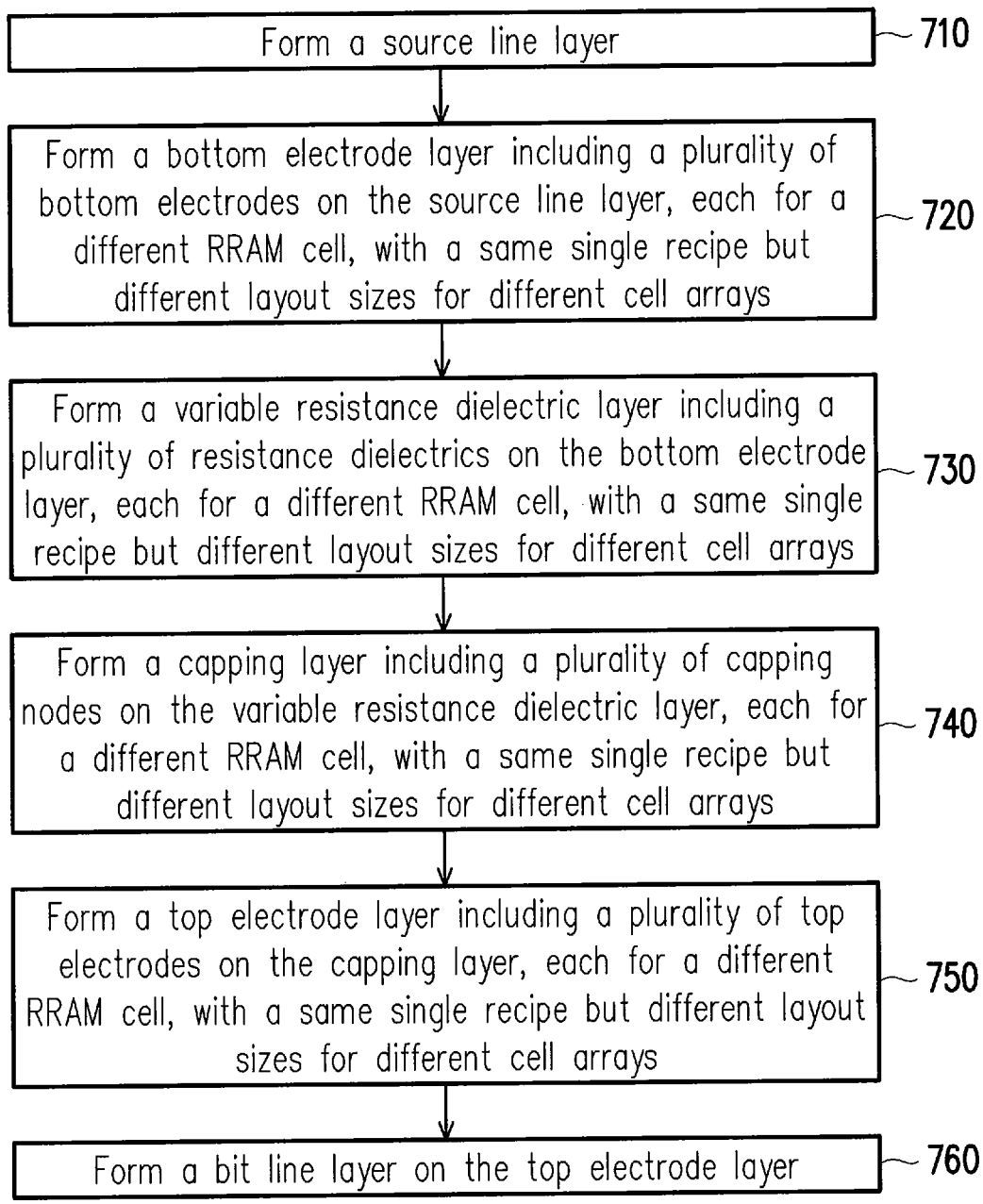
FIG. 7 illustrates a flow chart of an exemplary method to fabricate the RRAM macro of FIG. 2, in accordance with some embodiments.

FIG. 7 illustrates a flow chart of an exemplary method 700 to fabricate the RRAM macro 108 of FIG. 2, in accordance with some embodiments. As discussed above, the RRAM macro 108 includes different RRAM cell arrays 202, 204, 206. Each of the RRAM cell arrays 202, 204, 206 may include a resistor between a source line and a bit line. The resistor may be formed as a multi-layer stack that includes a top electrode, a capping node, a resistance dielectric, and a bottom electrode.

As shown in FIG. 7, a source line layer is formed at operation 710. At operation 720, a bottom electrode layer including a plurality of bottom electrodes is formed on the source line layer. Each of the plurality of bottom electrodes is formed for a different RRAM cell. The bottom electrodes are formed using a same single recipe but different layout sizes for different cell arrays. As such, bottom electrodes in different cell arrays 202, 204, 206 can have same thickness and crystalline structure, but different diameters. At operation 730, a variable resistance dielectric layer including a plurality of resistance dielectrics is formed on the bottom electrode layer. Each of the plurality of resistance dielectrics is formed for a different RRAM cell. The resistance dielectrics are formed using a same single recipe but different layout sizes for different cell arrays. As such, resistance dielectrics in different cell arrays 202, 204, 206 can have same thickness and crystalline structure, but different diameters. At operation 740, a capping layer including a plurality of capping nodes is formed on the variable resistance dielectric layer. Each of the plurality of capping nodes is formed for a different RRAM cell. The capping nodes are formed using a same single recipe but different layout sizes for different cell arrays. As such, capping nodes in different cell arrays 202, 204, 206 can have same thickness and crystalline structure, but different diameters. At operation 750, a top electrode layer including a plurality of top electrodes on the capping layer. Each of the plurality of top electrodes is formed for a different RRAM cell. The top electrodes are formed using a same single recipe but different layout sizes for different cell arrays. As such, top electrodes in different cell arrays 202, 204, 206 can have same thickness and crystalline structure, but different diameters. A bit line layer is formed on the top electrode layer at operation 760.

In an embodiment, a memory architecture includes: a plurality of cell arrays that each comprises a plurality of bit cells, wherein each of the bit cells of the plurality of cell arrays uses a respective variable resistance dielectric layer to transition between first and second logic states; and a control logic circuit, coupled to the plurality of cell arrays, and configured to cause a first information bit to be written into respective bit cells of a pair of cell arrays as an original logic state of the first information bit and a logically complementary logic state of the first information bit, wherein the respective variable resistance dielectric layers are formed by using a same recipe of deposition equipment and have different diameters.

In another embodiment, a memory architecture includes: a first cell array comprising a first plurality of bit cells; a second cell array comprising a second plurality of bit cells; a third cell array comprising a third plurality of bit cells; and a control logic circuit, coupled to the first, second, and third cell arrays, and configured to cause a first information bit to be written into respective bit cells of the first and second cell arrays as an original logic state of the first information bit and a logically complementary logic state of the first information bit, and a second information bit into a bit cell of the third cell array as an original logic state of the second information bit, such that the respective bit cells of the first and second cell arrays have a first endurance and the bit cell of the third cell array has a second endurance, wherein the first endurance comprises a maximum number of cycles for which the respective bit cells of the first and second cell arrays can transition between respective different resistance states, and the second endurance comprises a maximum number of cycles for which the bit cell of the third cell array can transition between respective different resistance states.

In yet another embodiment, a method includes: providing a memory architecture comprising a plurality of memory cell arrays, wherein respective memory cells of the plurality of memory cell arrays share a universal variable resistance dielectric layer; selecting first and second memory cell arrays of the plurality of memory cell arrays to be used in a first application with a first endurance; selecting a third memory cell array of the plurality of memory cell arrays to be used in a second application with a second endurance; writing a first information bit into respective memory cells of the first and second memory cell arrays as the first information bit's original and complementary logic states; and writing a second information bit into a memory cell of the third memory cell array as the second information bit's original logic state, wherein the first endurance comprises a maximum number of cycles for which the respective memory cells of the first and second cell arrays can transition between respective different resistance states, and the second endurance comprises a maximum number of cycles for which the memory cell of the third cell array can transition between respective different resistance states.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of cell arrays comprising
a first cell array comprising a first plurality of bit cells using a first variable resistance dielectric layer to transition between logic states, a second cell array comprising a second plurality of bit cells using a second variable resistance dielectric layer to transition between logic states, and a third cell array comprising a third plurality of bit cells using a third variable resistance dielectric layer to transition between logic states; and a control logic circuit configured to cause a first information bit to be written into respective bit cells of the first and second cell arrays as an original logic state of the first information bit and a logically complementary logic state of the first information bit, and cause a second information bit to be written into a single bit cell of the third cell array as an original logic state of the second information bit, wherein each of the first and second variable resistance dielectric layers has a first diameter, and the third variable resistance dielectric layer has a second diameter that is different from the first diameter.

2. The memory device of claim 1, wherein the first, second, and third variable resistance dielectric layers are formed based on a same recipe of deposition equipment, and share substantially an identical thickness and/or crystalline structure.

3. The memory device of claim 1, wherein the first diameter is smaller than the second diameter.

4. The memory device of claim 1, further comprising:
a sensing circuit, coupled to the first, second and third pluralities of bit cells, and configured to determine the first information bit's original logic state present by the respective bit cells of the first and second cell arrays by comparing respective current signals conducting through the respective bit cells of the first and second cell arrays.

5. The memory device of claim 4, wherein:
the first and second cell arrays are disposed at respective opposite sides of the sensing circuit; and
the sensing circuit is further configured to determine the second information bit's original logic state present by the single bit cell of the third cell array by comparing a current signal conducting through the single bit cell of the third cell array with a reference current signal.

6. The memory device of claim 1, wherein:
each of the first, second and third pluralities of bit cells comprises a resistive random access memory (RRAM) bit cell; and
the plurality of cell arrays are formed as a memory macro disposed on a single chip.

7. A memory device, comprising:
a first cell array comprising a first plurality of bit cells;
a second cell array comprising a second plurality of bit cells;
a third cell array comprising a third plurality of bit cells; and
a control logic circuit, coupled to the first, second, and third cell arrays, and configured to cause a first information bit to be written into respective bit cells of the first and second cell arrays as an original logic state of the first information bit and a logically complementary logic state of the first information bit, and a second information bit into a bit cell of the third cell array as an original logic state of the second information bit, such that the respective bit cells of the first and second cell arrays have a first endurance and the bit cell of the third cell array has a second endurance.

8. The memory device of claim 7, wherein:
the first endurance comprises a maximum number of cycles for which the respective bit cells of the first and second cell arrays can transition between respective different resistance states; and
the second endurance comprises a maximum number of cycles for which the bit cell of the third cell array can transition between respective different resistance states.

9. The memory device of claim 7, wherein the first endurance is substantially higher than the second endurance.

10. The memory device of claim 7, wherein:
the first, second, and third pluralities of bit cells have a substantially identical variable resistance dielectric layer; and
the variable resistance dielectric layer comprises a thickness and crystalline structure that is formed by using a same recipe of deposition equipment.

11. The memory device of claim 7, further comprising:
a sensing circuit, coupled to the first, second, and third cell arrays, and configured to read out the original logic state of the first information bit present by the respective bit cells of the first and second cell arrays by comparing respective current signals conducting through the respective bit cells of the first and second cell arrays.

12. The memory device of claim 11, wherein the first and second cell arrays are disposed at respective opposite sides of the sensing circuit.

13. The memory device of claim 11, wherein the sensing circuit is further configured to read out the original logic state of the second information bit present by the bit cell of the third cell array by comparing a current signal conducting through the bit cell of the third cell array with a reference current signal.

14. The memory device of claim 7, wherein each of the first, second, and third pluralities of bit cells comprises a resistive random access memory (RRAM) bit cell.

15. The memory device of claim 7, wherein:
the first, second, and third cell arrays are formed as a memory macro disposed on a single chip; and
the first, second, and third pluralities of bit cells have respective variable resistance dielectric layers that are formed by a same recipe of deposition equipment but have different diameters.

16. A method, comprising:
selecting, from a plurality of memory cell arrays, first and second memory cell arrays to be used in a first application with a first endurance;
selecting, from the plurality of memory cell arrays, a third memory cell array to be used in a second application with a second endurance;
writing a first information bit into respective memory cells of the first and second memory cell arrays as the first information bit's original and complementary logic states; and
writing a second information bit into a memory cell of the third memory cell array as the second information bit's original logic state.

17. The method of claim 16, wherein respective memory cells of the plurality of memory cell arrays share a universal variable resistance dielectric layer.

18. The method of claim 17, wherein:
the first endurance comprises a maximum number of cycles for which the respective memory cells of the first and second cell arrays can transition between respective different resistance states; and the second endurance comprises a maximum number of cycles for which the memory cell of the third cell array can transition between respective different resistance states.

19. The method of claim 17, wherein the universal variable resistance dielectric layer comprises a thickness and crystalline structure that is formed by using a same recipe of deposition equipment.

20. The method of claim 16, wherein the first endurance is substantially higher than the second endurance.

* * * * *